(12) United States Patent
Cerminara et al.

(10) Patent No.: US 11,990,029 B1
(45) Date of Patent: May 21, 2024

(54) POLARITY REVERSABLE ELECTRONIC TWO WIRE SWITCH

(71) Applicant: United Electric Controls Co., Watertown, MA (US)

(72) Inventors: Anthony J. Cerminara, Revere, MA (US); Jeffrey V. Davis, Woburn, MA (US); Levon Khatchadourian, Waltham, MA (US); David Wilbur, Braintree, MA (US)

(73) Assignee: United Electric Controls Co., Watertown, MA (US)

( * ) Notice: Subject to any disclaimer, the term of this patent is extended or adjusted under 35 U.S.C. 154(b) by 204 days.

(21) Appl. No.: 17/716,012

(22) Filed: Apr. 8, 2022

Related U.S. Application Data

(60) Provisional application No. 63/172,776, filed on Apr. 9, 2021.

(51) Int. Cl.
| | | |
|---|---|---|
| *H01H 35/00* | (2006.01) | |
| *G08C 19/02* | (2006.01) | |
| *H03K 17/693* | (2006.01) | |
| *H03K 17/74* | (2006.01) | |

(52) U.S. Cl.
CPC ......... *G08C 19/025* (2013.01); *H03K 17/693* (2013.01); *H03K 17/74* (2013.01)

(58) Field of Classification Search
CPC .... H01H 35/00; G08C 19/025; H03K 17/693; H03K 17/74
See application file for complete search history.

(56) References Cited

U.S. PATENT DOCUMENTS

| | | | |
|---|---|---|---|
| 3,768,072 A | 10/1973 | Gaddy | |
| 4,482,818 A | 11/1984 | Ryczek et al. | |
| 5,200,743 A | 4/1993 | St. Martin et al. | |
| 5,306,955 A | 4/1994 | Fryer | |
| 5,635,896 A | 6/1997 | Tinsley et al. | |
| 6,522,249 B1 * | 2/2003 | Lonigro | H04Q 9/00 340/533 |
| 6,560,279 B1 | 5/2003 | Renz | |
| 2003/0160517 A1 | 8/2003 | Lo et al. | |
| 2006/0208915 A1 * | 9/2006 | Oakner | G01F 23/0053 340/620 |
| 2008/0054084 A1 | 3/2008 | Olson | |

FOREIGN PATENT DOCUMENTS

| | | | |
|---|---|---|---|
| DE | 4335415 C1 * | 12/1994 | ............ H01H 47/22 |
| DE | 4335415 C1 | 12/1994 | |
| WO | WO 89/08351 A1 | 9/1989 | |

\* cited by examiner

*Primary Examiner* — Benyam Haile
(74) *Attorney, Agent, or Firm* — Wolf, Greenfield & Sacks, P.C.

(57) ABSTRACT

A switch interface for a remote device includes circuitry coupled to at least first and second terminals of the switch interface, configured to receive power over a two-wire connection through the at least first and second terminals. The circuitry is configured to send information regarding a parameter sensed by the remote device through the at least first and second terminals over the two-wire connection. The circuitry is operable to provide the power to the remote device and send the information when first and second wires of the two-wire connection are connected to the at least first and second terminals in a first polarity and a second polarity different from the first polarity.

10 Claims, 8 Drawing Sheets

POLARITY REVERSABLE ELECTRONIC TWO WIRE SWITCH

CROSS-REFERENCE TO RELATED APPLICATION

The present application claims priority under 35 U.S.C. 119(e) to U.S. provisional application Ser. No. 63/172,776, titled "POLARITY REVERSABLE ELECTRONIC TWO WIRE SWITCH," filed Apr. 9, 2021, which is hereby incorporated by reference in its entirety.

BACKGROUND

1. Technical Field

The technology described herein relates to remote devices that both provide information output to and receive operating power over a two-wire connection.

2. Discussion of the Related Art

The present application describes an improvement in the 2-Wire switch technology described in U.S. Pat. No. 6,522,249, which is hereby incorporated by reference in its entirety.

As described in U.S. Pat. No. 6,522,249, it is often desirable to monitor the pressure or temperature of a fluid or gas in an industrial process and to signal when a certain threshold has been exceeded. There are several devices known in the art that provide such monitoring. These devices may compare the measured value of pressure or temperature to a programmed threshold and provide a switch transition to indicate that the threshold has been exceeded.

SUMMARY

Some embodiments relate to a switch interface for a remote device, the switch interface comprising: circuitry coupled to at least first and second terminals of the switch interface, configured to receive power over a two-wire connection through the at least first and second terminals, and configured to send information regarding a parameter sensed by the remote device through the at least first and second terminals over the two-wire connection, wherein the circuitry is operable to provide the power to the remote device and send the information when first and second wires of the two-wire connection are connected to the at least first and second terminals in a first polarity and a second polarity different from the first polarity.

Some embodiments relate to a switch interface for a remote device, comprising: a first terminal, a second terminal and a third terminal; and circuitry coupled to the first, second and third terminals, configured to receive power over a two-wire connection through at least two of the first, second and third terminals to power the remote device, and configured to send information regarding a parameter sensed by the remote device through the at least two of the first, second and third terminals over the two-wire connection, wherein the circuitry is operable to provide the power to the remote device and send the information when first and second wires of the two-wire connection are connected to the at least two of the first, second and third terminals in a first polarity and a second polarity different from the first polarity.

Some embodiments relate to a method of operating the switch interface.

The foregoing summary is by way of illustration and is not intended to be limiting.

BRIEF DESCRIPTION OF THE DRAWINGS

In the drawings, each identical or nearly identical component that is illustrated in various figures is represented by a like reference character. For purposes of clarity, not every component may be labeled in every drawing. The drawings are not necessarily drawn to scale, with emphasis instead being placed on illustrating various aspects of the techniques and devices described herein.

Examples of suitable wiring configurations for a switch interface are shown in FIGS. 1A-1J.

DETAILED DESCRIPTION

Figure 1A:
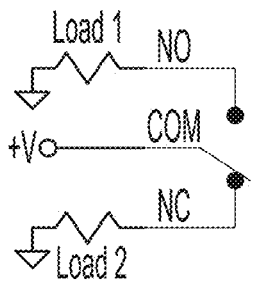
Figure 1B:
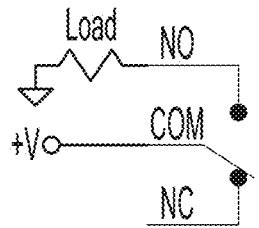
Figure 1C:
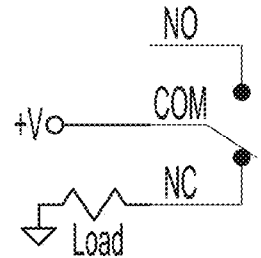
Figure 1D:
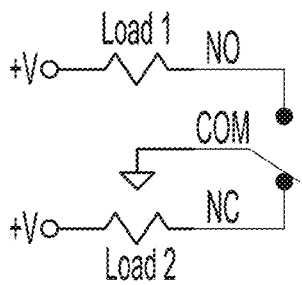
Figure 1E:
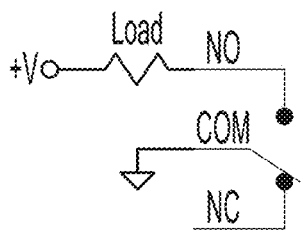
Figure 1F:
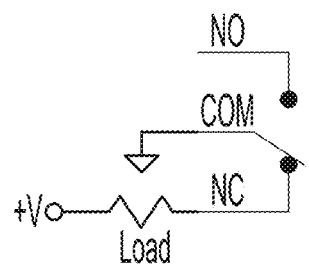
Figure 1G:
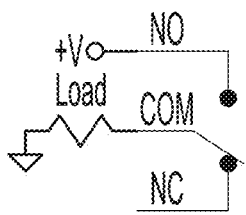
Figure 1H:
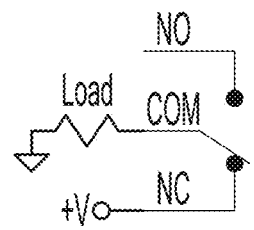
Figure 1I:
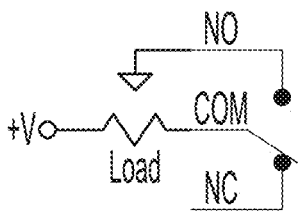
Figure 1J:
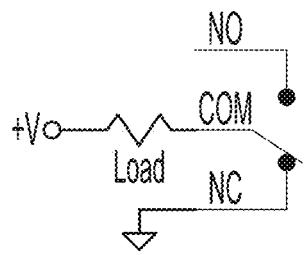

Threshold detection and switching functions can be performed using a variety of electromechanical or electronic devices. Electromechanical pressure and temperature switches employ mechanical means to open or close a switch contact or set of switch contacts when certain conditions are satisfied. Such electromechanical switches generally require no power to operate, and therefore the only wire connection that need be made to the device is a two-wire connection to detect the switch state. However, electromechanical switches are in general less flexible than electronic switches in that the threshold must be set at the factory or adjusted in the field using specialized equipment.

Electronic pressure and temperature switches offer various modes of operation, adjustable thresholds and other features that can be programmed by the user in the field. They may include circuitry to monitor, display and communicate information about the overall status and health of the device and system. While these devices offer more flexibility, they typically require additional wires to supply power for the electronic circuitry. They may also require a battery or other power source at the switch. This additional wiring or local power supply contributes to the cost of field installations and is also a source of potential failure. Additionally, the need for extra power wires excludes the use of electronic switches as direct replacements for two-wire mechanical devices. There are also maintenance and reliability disadvantages of a battery at the switch.

To address this problem, a switch interface is described in U.S. Pat. No. 6,522,249 that receives power for the remote device over a two-wire connection, and sends information regarding a parameter sensed by the remote device over the same two-wire connection. For example, the remote device includes a sensor such as a temperature or pressure sensor. Alternatively or additionally, the sensor may sense another parameter such as flow, level of vibration, or gas concentration. The remote device may determine whether the sensed parameter such as temperature or pressure is above or below a threshold, and send this information over the two-wire connection. As an example, the information that is sent over the two-wire connection by the remote device may be a binary value indicating whether the sensed parameter is above or below the threshold. The binary value may be communicated over the two-wire connection by setting the impedance (and thus the current) provided by the switch interface at the two-wire connection. A low current may indicate one binary value while a high current may indicate the opposite binary value. For example, the switch interface may set a low impedance (high current) between the two terminals of the two-wire connection to indicate a sensed parameter (e.g., temperature, pressure) is above a threshold, and may set a high impedance (low current) between the two terminals of the two-wire connection to indicate the sensed parameter is below the threshold. Such a configuration may be termed a normally-open (NO) configuration. Alternatively, the switch interface may set a high impedance (low current) between the two terminals of the two-wire connection to indicate a sensed parameter (e.g., temperature, pressure) is above a threshold, and may set a low impedance (high current) between the two terminals of the two-wire connection to indicate the sensed parameter is below the threshold. Such a configuration may be termed a normally-closed (NC) configuration. The remote device may be programmed with the configuration as NO or NC, and a processor may control the switch circuit according to the programmed configuration.

The inventor(s) have recognized and appreciated the switch circuit of U.S. Pat. No. 6,522,249 needs to have the two-wire connection connected with the correct polarity. That is, the terminal SW OUT+ (FIG. 3B) needs to be connected to a higher voltage than the voltage to which SW OUT− needs to be connected. If the polarities are reversed the switch interface will not operate.

The inventor(s) have further recognized and appreciated that it would be desirable to allow the terminals of the two-wire connection to be connected with either polarity. That is, having two-wire connection terminals with reversable polarity allows either terminal to have a higher or lower voltage with respect to the other terminal. Such a capability simplifies installation of a remote device by removing the requirement for a technician to connect the wires of the two-wire connection to the correct terminals of the remote device.

Described herein is a switch interface that receives power for a remote device over a two-wire connection and sends sensed information over the two-wire connection. Such a switch interface may serve as a replacement for a single-pole-double-throw (SPDT) switch. An SPDT switch has three terminals termed NO, NC and COM, with the SPDT switch connecting either NO or NC to COM. The switch interface described herein may have three terminals also termed NO, NC or COM, which may serve the same functions as an SPDT switch. In some embodiments the switch interface is configured such that the two wires of the two-wire connection may be connected to the COM terminal of the switch interface and one or both of the NO and NC terminals, in any polarity. The switch interface may be wired in the same way as an electromechanical switch. Wiring to COM and NO provides for a normally-open connection. Wiring to COM and NC provides for a normally-closed connection. Accordingly, the switch interface described herein does not require complex programming, as the operating modes are set by the wiring configuration. Accordingly, there is no need for programming to set a normally-open or normally-closed state (e.g., Open on Rise, Close on Rise, Open on Fall and Close on Fall). Rather, the processor of the remote device may be programmed with a setpoint of a parameter (e.g., temperature, pressure, etc.) and a reset point for the parameter at which the switch interface transitions back to the normally-open or normally-closed state set by wiring to NO or NC. Advantageously, the switch interface operates regardless of whether the polarity between COM and NO is reversed or whether the polarity between COM and NC is reversed.

The switch interface may be a self-powered electronic switch with NO (Normally Open), COM (Common) and NC (Normally Closed) terminals. The device derives operating power from either one open contact, one closed contact or a combination of both. The terminals may be wired in any sinking or sourcing configuration as with an SPDT electromechanical switch.

The switch interface may be wired in many configurations, such as an SPDT mechanical switch, and without regard for polarity. Examples of suitable wiring configurations are shown in FIGS. 1A-1J. FIGS. 1A-1J show the connections made to the terminals NO, NC and COM at the exterior of the switch interface by the two-wire connection. If a load is present, as illustrated in some examples in FIGS. 1A-1J, the load may be any suitable load.

Figure 2:
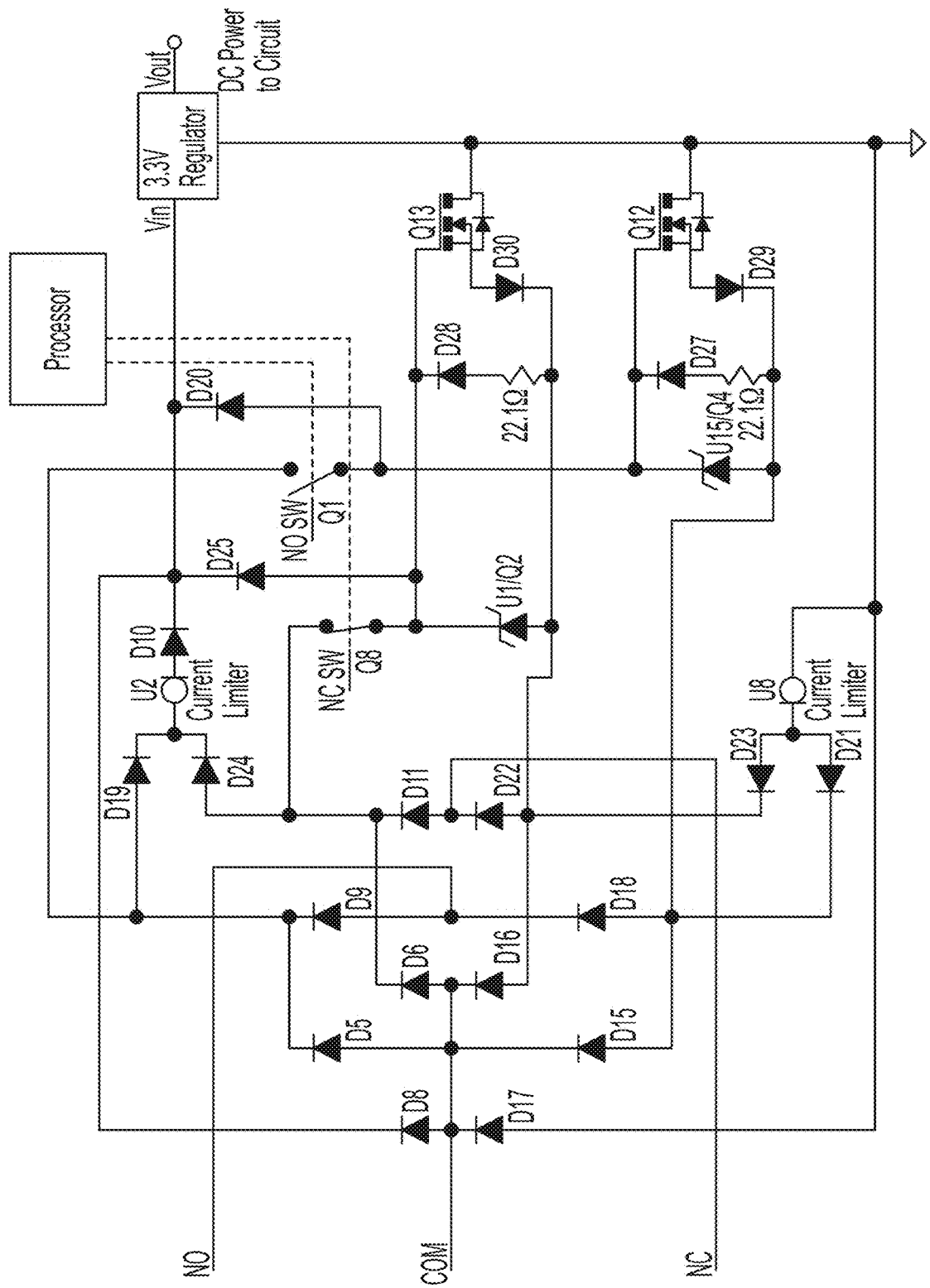
FIG. 2 shows a diagram of an example of a switch interface.

In some embodiments, the switch interface includes an array of diodes to route the current to the appropriate switch transistors, current limiters and the shunt voltage regulators regardless of the wiring polarity or how the load and power supply are connected. A diagram of one example of the switch interface is shown in FIG. 2. A description of the components follows. NO, NC and COM are switch contacts similar to an SPDT switch. Reference characters beginning with "Q" refer to transistors, while reference characters beginning with "D" refer to diodes. Q8 is a normally closed switch transistor, controlled by the processor using software and/or firmware. Q1 is a normally open switch transistor, controlled by the processor using software and/or firmware. Q1 and Q8 are controlled in a way that is mutually exclusive—when one is on (closed, conductive) the other is off (open, non-conductive). U1/Q2, associated with the normally closed switch, forms a shunt voltage regulator. The behavior is similar to a zener diode. U1/Q2 may be a shunt regulator and may have the same function as the shunt regulator 66 of U.S. Pat. No. 6,522,249. U1/Q2 may be implemented with a transistor circuit and a voltage reference, and may behave like an ideal diode. Such an implementation may have improved voltage and temperature stability and lower leakage current than a Zener diode. Similarly, U15/Q4, associated with the normally open switch, also forms a shunt voltage regulator. The behavior is similar to that of a Zener diode. Q13 turns on with Q8 and provides a return path for the current used by the circuit. Q12 turns on with Q1 and provides a return path for the current used by the circuit. The current limiters U2 and U8 may have the same function as the current regulator 62 in U.S. Pat. No. 6,522,249. The regulator labeled 3.3V Regulator may have the same function as voltage regulator 64 of U.S. Pat. No. 6,522,249, and may regulate the voltage to any suitable level, not limited to 3.3V.

The following is a description of operation of the NC contact when the switch is in the normal state (NC=Closed). Q8 (Switch Transistor) works in combination with U1/Q2 (Shunt Voltage Regulator) to create a closed condition on the NC switch contact when the switch is in the normal state. It does so by clamping the voltage between these contacts to approx. 5V, similar to a Zener diode. Q13 turns on when Q8 is on providing a return path for the operating current used by the circuit. It does so by connecting the internal circuit ground to the low side of the shunt voltage regulator. Current to power the circuit is fed to the regulator through D8 when the voltage on COM is more positive than NC. Current to power the circuit is fed to the regulator through D11 and D25 when the voltage on NC is more positive than COM. Diode D6 routes the excess current to Q8 when the COM is more positive than the NC contact. Diode D11 routes the total current to Q8 when the NC is more positive than the COM contact. The excess current flows through the shunt voltage regulator, while the circuit current flows to the regulator. The voltage +24V shown in the figures can be any voltage, DC or AC, not limited to +24V. The voltage is referenced to the voltage labeled 24V Return, which is system ground. The voltage regulator is referenced to internal ground, which may be above the voltage of the system ground (e.g., 1 V above system ground, or 19 V in a 24 system, depending on the wiring configuration).

The loads shown in the drawings are located at the other end of the two-wire connection. For example, the load may be at the utilization mechanism of U.S. Pat. No. 6,522,249. The load may be part of a device that detects the information sensed by the remote device. For example, the load may be part of a programmable logic controller (PLC) that detects the information, or part of another device such as an indicator (e.g., light), relay or solenoid valve. The load may limit the current through the switch interface.

The following is a description of operation of the NC contact when the switch is in the actuated state (NC=Open) and NC is more positive than COM. Current flows to the regulator through D11, D24, U2 and D10 when NC is more positive than COM. The return path for the current is from the internal circuit ground, through U8, D21 and D15. U2 and U8 limit the available current to the circuit. It is set just above the average required operating current. This leakage current is perceived as an off condition by the load.

The following is a description of operation of the NC contact when the switch is in the actuated state (NC=Open) and COM is more positive than NC. Current flows to the regulator through D6, D24, U2 and D10 when COM is more positive than NC. The return path for the current is from the internal circuit ground, through U8, D23 and D22. Again, U2 and U8 limit the available current to the circuit. It is set just above the average required operating current. This leakage current is perceived as an off condition by the load.

The following is a description of sourcing to loads on both NC and NO contacts when the switch is in the normal state (NC=Closed, NO=Open). Circuit current is fed to the regulator through D8. Excess current is passed through D6 and through the shunt voltage regulator associated with the NC contact (Q8, U1/Q2). Q13 is on and provides a return path for the circuit current. The internal circuit ground is clamped at about 18.5 volts, 24V minus the drop of the shunt voltage regulator. Total current is returned through D22 to the NC contact. Since the internal circuit ground is at 18.5V, current going back to the NO contact is limited by U8 through D21 and D18. This is necessary to prevent an on condition at the NO contact.

The following is a description of sinking to loads on both NC and NO contacts when the switch is in the normal state (NC=Closed, NO=Open). Circuit current is fed to the regulator through D9, D19, Current Limiter U2 and D10. Excess current is passed through the shunt voltage regulator associated with the NC contact (D11, Q8, U1/Q2). Q13 is on and provides a return path for the circuit current. The internal circuit ground is clamped at about 1 V. Total current is returned through D16 to the COM. Current from the NO contact is limited by U2 through D9 and D19.

Figure 3:
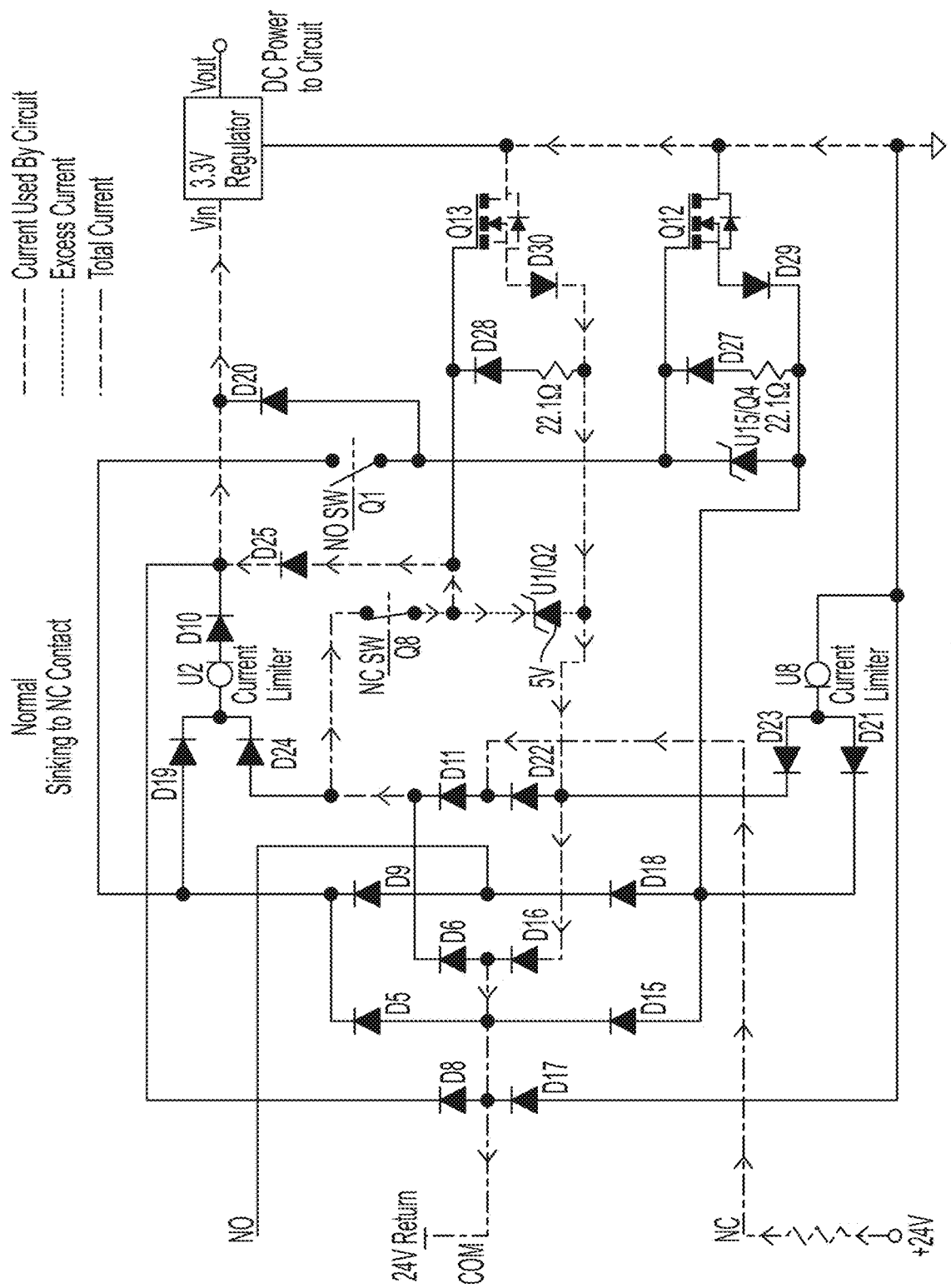
FIG. 3 illustrates current flow in a state of normal sinking in to the NC contact.
Figure 4:
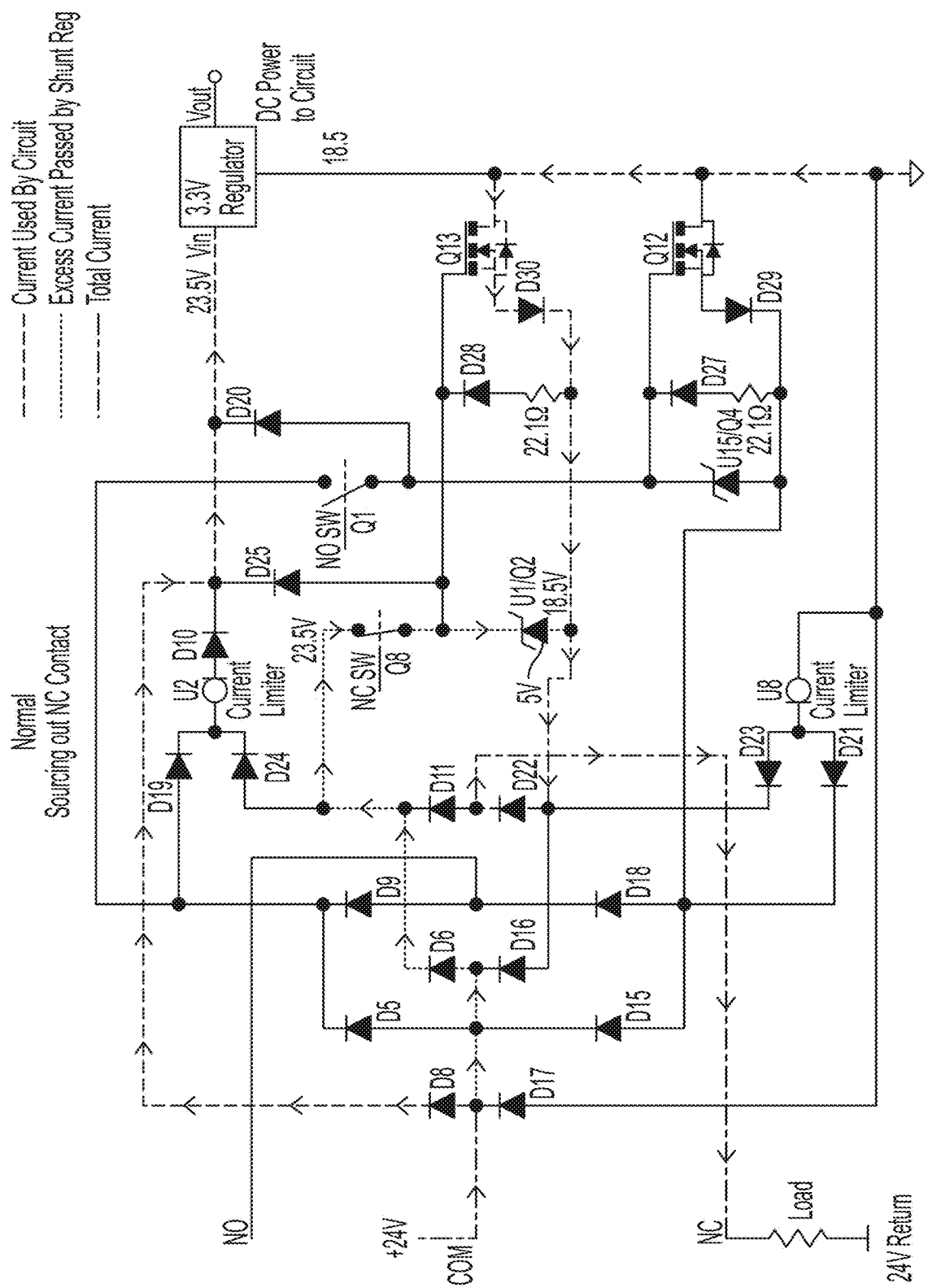
FIG. 4 illustrates current flow in a state of normal sourcing out to the NC contact.
Figure 5:
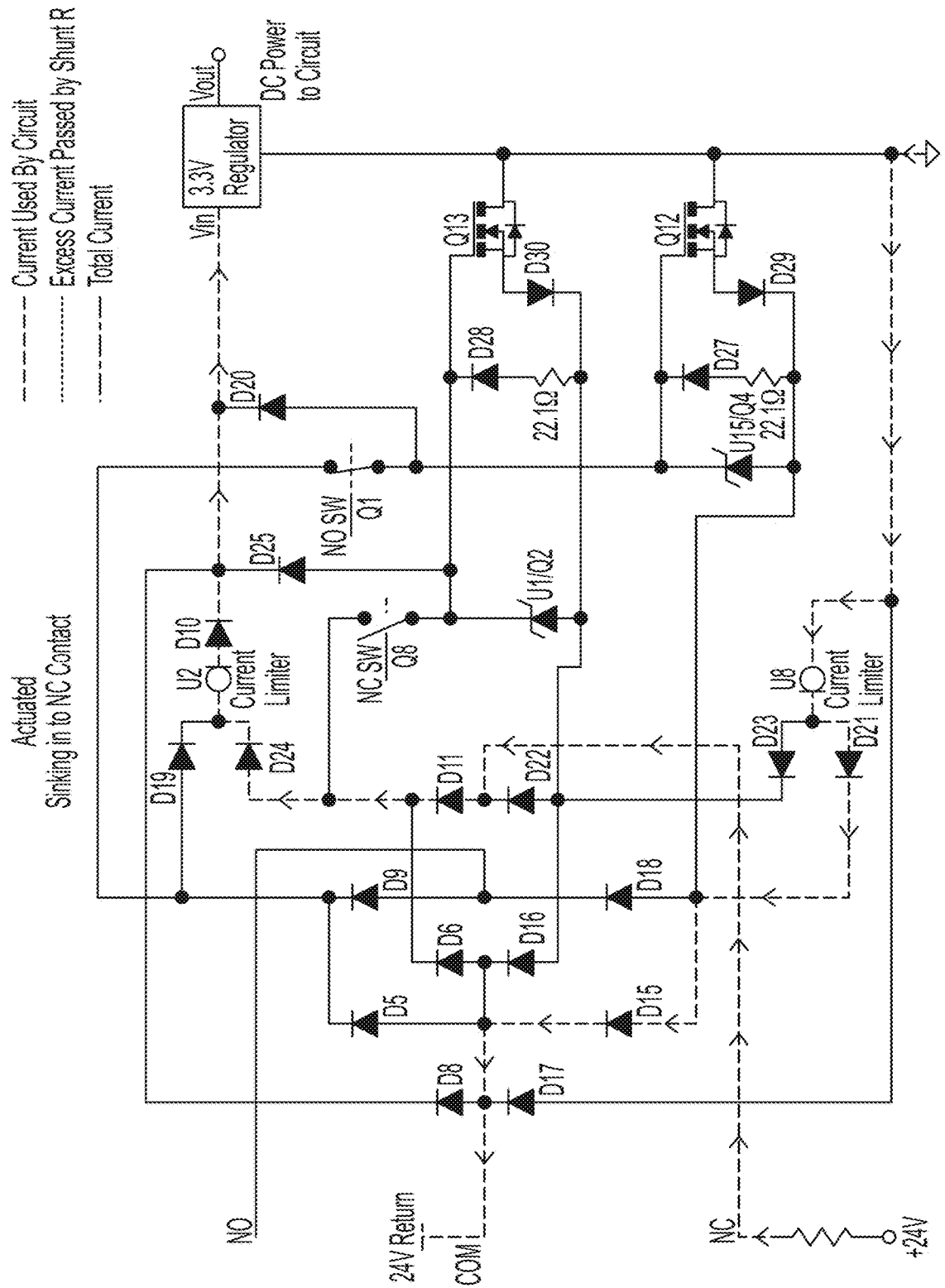
FIG. 5 illustrates current flow in a state of actuated sinking into the NC contact.
Figure 6:
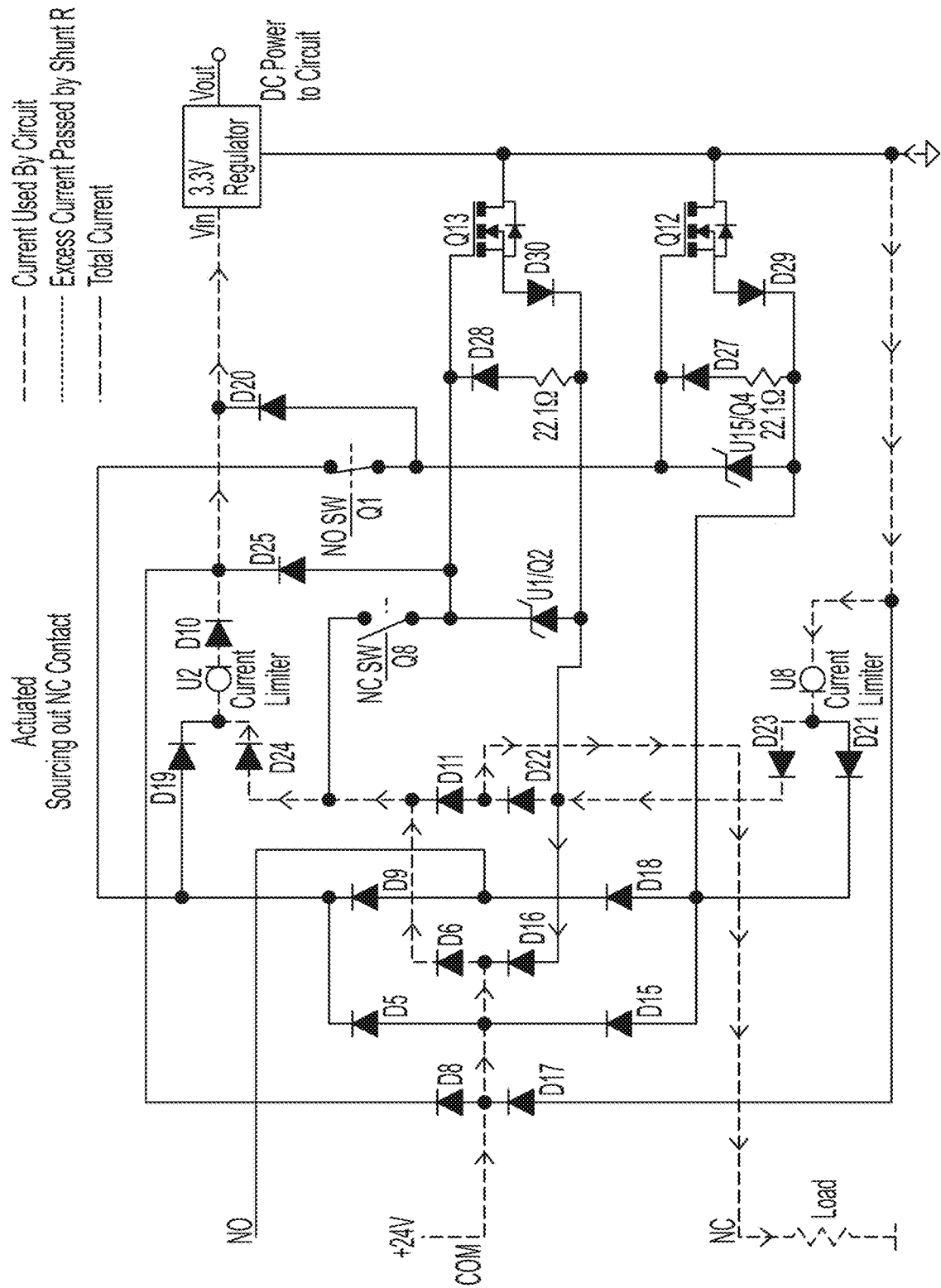
FIG. 6 illustrates current flow in a state of actuated sourcing out to the NC contact.
Figure 7:
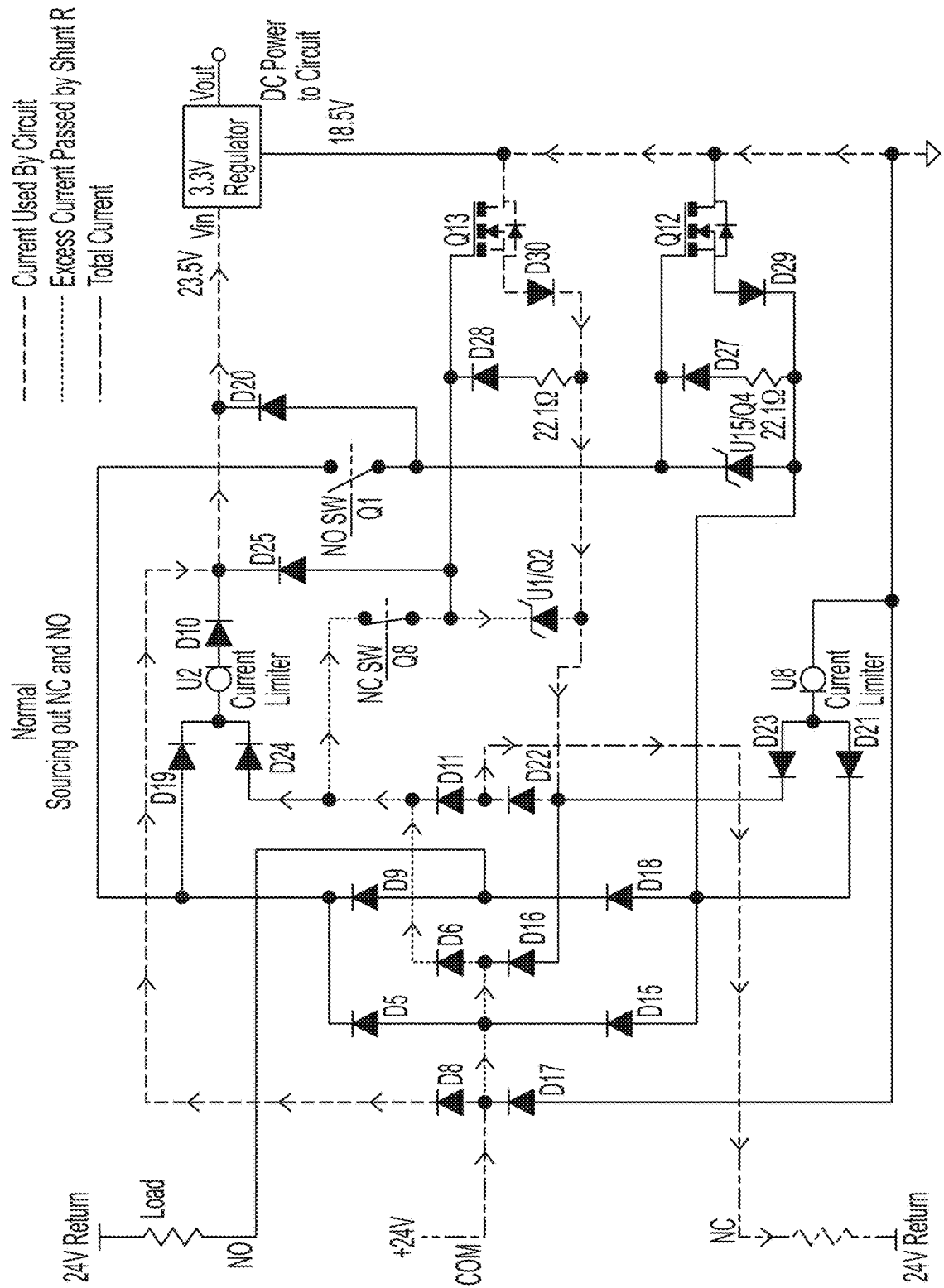
FIG. 7 illustrates current flow in a state of normal sourcing out NC and NO.
Figure 8:
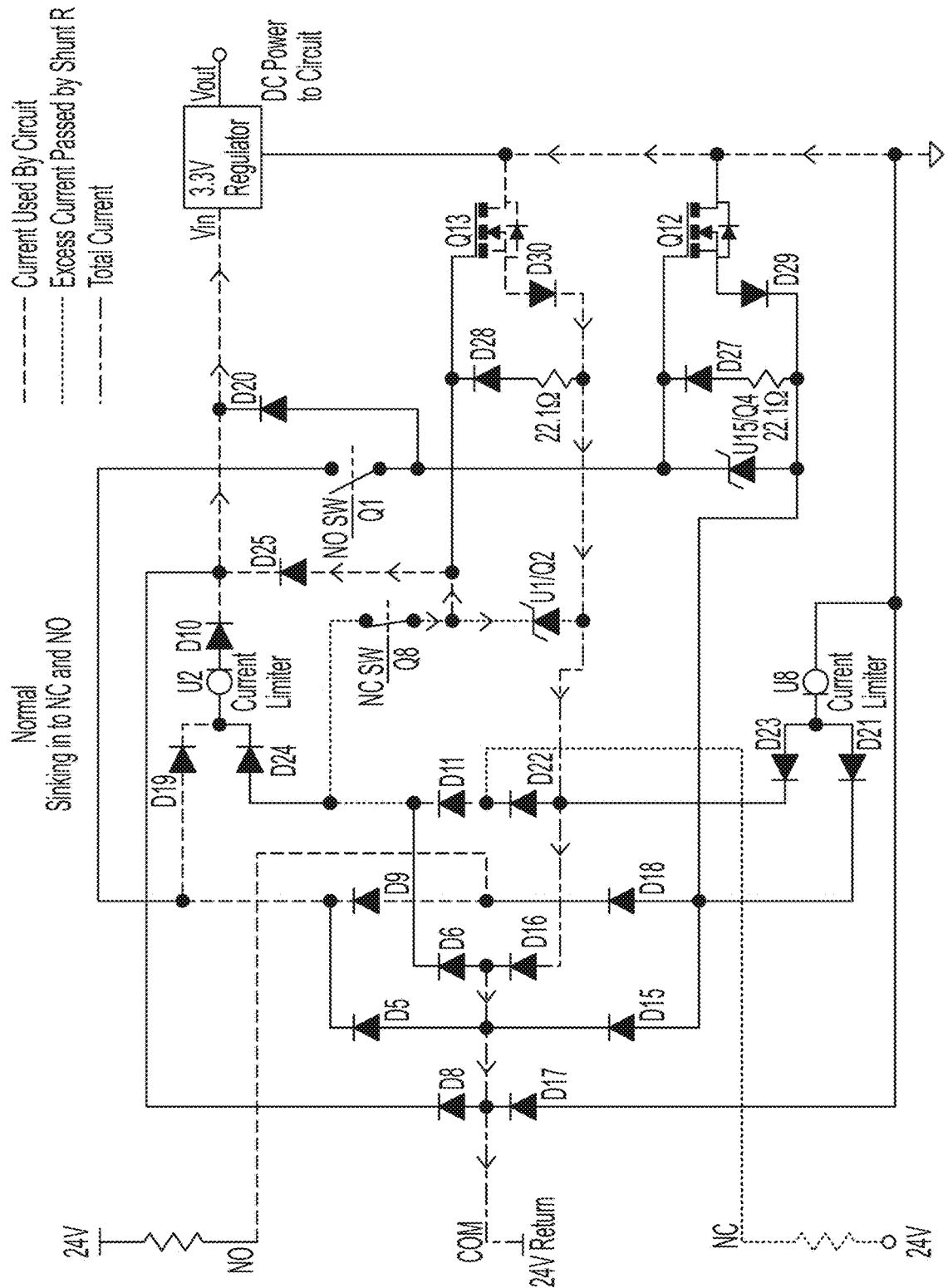
FIG. 8 illustrates current flow in a state of normal sinking in to NC and NO.

FIGS. 3-8 show the paths of current flow in various wiring configurations. Each shows the current used by the circuit, the excess current and the total current. FIG. 3 illustrates current flow in a state of normal sinking in to the NC contact. FIG. 4 illustrates current flow in a state of normal sourcing out to the NC contact. FIG. 5 illustrates current flow in a state of actuated sinking into the NC contact. FIG. 6 illustrates current flow in a state of actuated sourcing out to the NC contact. FIG. 7 illustrates current flow in a state of normal sourcing out NC and NO. FIG. 8 illustrates current flow in a state of normal sinking in to NC and NO.

As used herein, the term "wire" includes any electrically conductive connection.

The two-wire connection includes no more than two wires extending from the remote device to the device that provides power (e.g., a utilization mechanism of U.S. Pat. No. 6,522,249) to the remote device.

Various aspects of the apparatus and techniques described herein may be used alone, in combination, or in a variety of arrangements not specifically discussed in the embodiments described in the foregoing description and is therefore not limited in its application to the details and arrangement of components set forth in the foregoing description or illustrated in the drawings. For example, aspects described in one embodiment may be combined in any manner with aspects described in other embodiments.

The processors described in the above-described embodiments can be implemented in any of numerous ways. It should be appreciated that software code can be executed on any suitable processor (e.g., a microprocessor) or collection of processors. It should be appreciated that any component or collection of components that perform the functions described above can be generically considered as one or more controllers that control the above-discussed functions. The one or more controllers can be implemented in numerous ways, such as with dedicated hardware, or with general purpose hardware (e.g., one or more processors) that is programmed using microcode or software to perform the functions recited above. The terms "computer program" and "software" are used herein in a generic sense to reference any type of computer code (e.g., application software, firmware, microcode, or any other form of computer instruction) that can be employed to program one or more processors to implement aspects of the techniques discussed herein.

Use of ordinal terms such as "first," "second," "third," etc., in the claims to modify a claim element does not by itself connote any priority, precedence, or order of one claim element over another or the temporal order in which acts of a method are performed, but are used merely as labels to distinguish one claim element having a certain name from another element having a same name (but for use of the ordinal term) to distinguish the claim elements.

Also, the phraseology and terminology used herein is for the purpose of description and should not be regarded as limiting. The use of "including," "comprising," or "having," "containing," "involving," and variations thereof herein, is meant to encompass the items listed thereafter and equivalents thereof as well as additional items.

What is claimed is:

1. A switch interface for a remote device, comprising:
a first terminal, a second terminal and a third terminal; and
circuitry coupled to the first, second and third terminals,
configured to receive power over a two-wire connection through at least two of the first, second and third terminals to power the remote device, and configured to send information regarding a parameter sensed by the remote device through the at least two of the first, second and third terminals over the two-wire connection, wherein the circuitry is operable to provide the power to the remote device and send the information when first and second wires of the two-wire connection are connected to the at least two of the first, second and third terminals in a first polarity and a second polarity different from the first polarity.

2. The switch interface of claim 1, wherein the circuitry is operable when the at least two of the first, second and third terminals includes a first terminal that is a common terminal and a second terminal that is a normally-open or a normally-closed terminal, and the first and second wires are connected to the at least two of the first, second and third terminals in either polarity.

3. The switch interface of claim 1, wherein the circuitry comprises a diode array for re-routing current through the switch interface to handle connections of the first and second polarities.

4. The switch interface of claim 1, wherein the circuitry comprises a plurality of switches controlled by a processor according to a programmed setpoint and reset point.

5. The switch interface of claim 1, wherein the circuitry further comprises a shunt regulator to regulate a voltage between the first and second wires to a fixed value when the circuitry presents a low impedance between the first and second wires.

6. The switch interface of claim 1, wherein the circuitry further comprises a voltage regulator to provide a regulated voltage to power the remote device from the power received over the two-wire connection.

7. The switch interface of claim 6, wherein the circuitry further comprises a plurality of current limiters to limit a current provided to the voltage regulator when the circuitry presents a high impedance between the first and second wires.

8. The switch interface of claim 1, wherein the information indicates whether the parameter sensed by the remote device is above or below a threshold.

9. The switch interface of claim 1, wherein the parameter sensed by the remote device is temperature, pressure flow, level of vibration, or gas concentration.

10. The switch interface of claim 1, wherein the first, second and third terminals correspond to terminals of an electromechanical single-pole-double-throw switch.

* * * * *